(12) United States Patent
Matsumoto et al.

(10) Patent No.: US 8,297,591 B2
(45) Date of Patent: Oct. 30, 2012

(54) SLIT VALVE CONTROL

(75) Inventors: Takayuki Matsumoto, San Jose, CA (US); Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 581 days.

(21) Appl. No.: 12/538,237

(22) Filed: Aug. 10, 2009

(65) Prior Publication Data
US 2010/0051111 A1 Mar. 4, 2010

Related U.S. Application Data

(60) Provisional application No. 61/093,288, filed on Aug. 29, 2008.

(51) Int. Cl.
*F16K 25/00* (2006.01)
*H01L 21/677* (2006.01)
(52) U.S. Cl. .................. 251/175; 251/195; 414/217
(58) Field of Classification Search .............. 251/172, 251/175, 195, 197, 198, 199; 414/217
See application file for complete search history.

(56) References Cited

U.S. PATENT DOCUMENTS

| | | | |
|---|---|---|---|
| 4,913,400 A * | 4/1990 | Tiefenthaler | 251/175 |
| 5,975,492 A * | 11/1999 | Brenes | 251/175 |
| 6,079,693 A | 6/2000 | Ettinger et al. | |
| 6,308,932 B1 | 10/2001 | Ettinger et al. | |
| 6,517,048 B2 | 2/2003 | Ettinger et al. | |
| 6,561,484 B2 * | 5/2003 | Nakagawa et al. | 251/175 |
| 6,854,708 B2 * | 2/2005 | Contin et al. | 251/167 |
| 7,086,638 B2 | 8/2006 | Kurita et al. | |
| 7,469,715 B2 | 12/2008 | Lee et al. | |
| 2002/0038528 A1 | 4/2002 | Blahnik | |
| 2005/0269334 A1 | 12/2005 | Bang et al. | |
| 2006/0011140 A1 | 1/2006 | Blahnik et al. | |
| 2006/0225811 A1 * | 10/2006 | Sheydayi et al. | 141/98 |

OTHER PUBLICATIONS

International Search Report and Written Opinion for PCT/US2009/054469 dated Mar. 11, 2010.

* cited by examiner

*Primary Examiner* — Eric Keasel
*Assistant Examiner* — Hailey K Do
(74) *Attorney, Agent, or Firm* — Patterson & Sheridan, LLP

(57) ABSTRACT

Embodiments disclosed herein generally relate to methods for sealing a processing chamber with a slit valve door. The door initially raises from a position below the opening for the processing chamber to a raised position. The door then expands until an O-ring that is on the door just touches the sealing surface. Then, the door expands again to compress the O-ring against the sealing surface. The door expands by flowing a gas into the interior volume of the door. By controlling the pressure buildup within the door, the speed with which the door expands is controlled to ensure that the door gently contacts the sealing surface and then compresses against the sealing surface. Thus, the door may be prevented from contacting the sealing surface with too great a force that may jolt or shake the processing chamber and produce undesired particles that may contaminate the process.

18 Claims, 6 Drawing Sheets

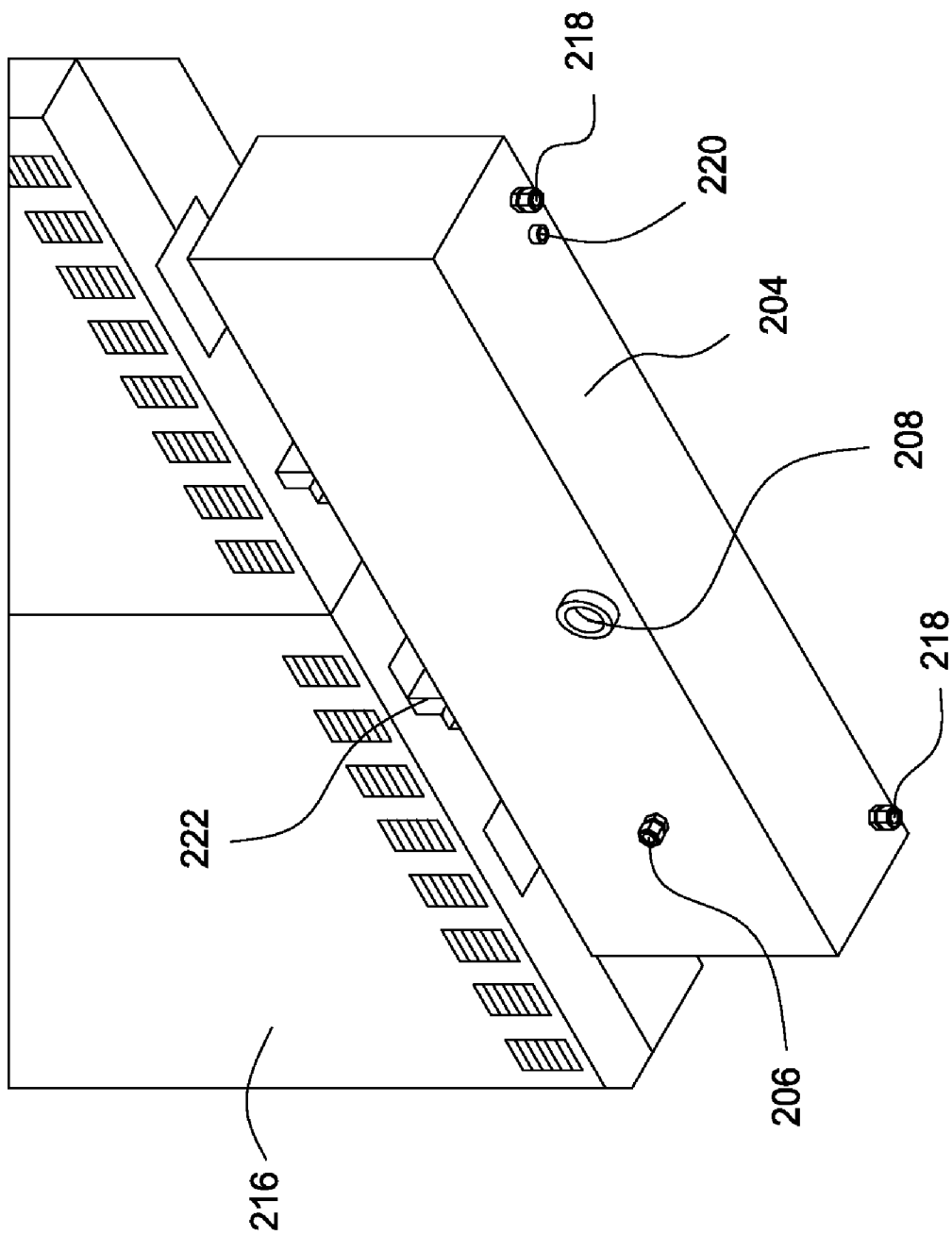

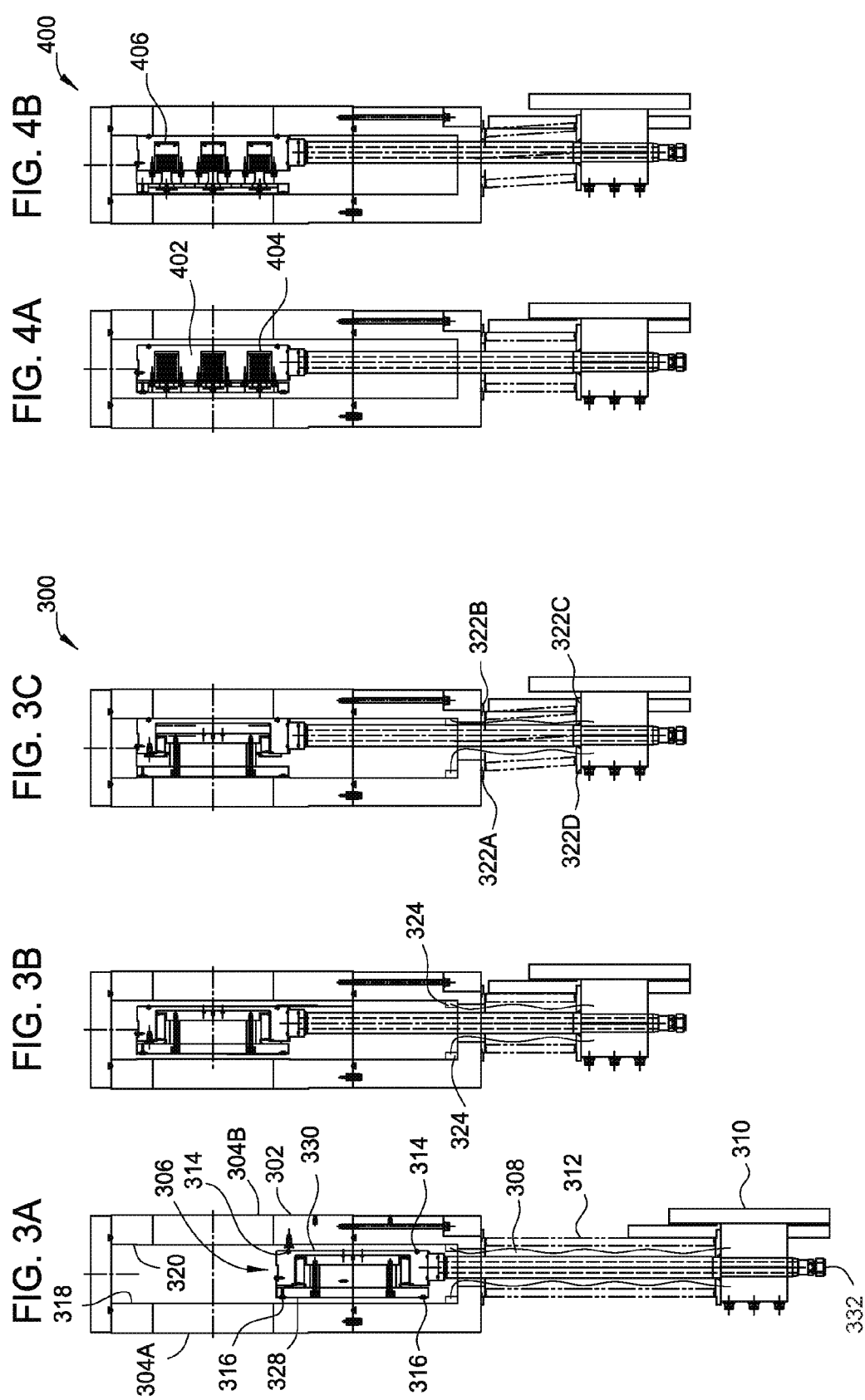

SLIT VALVE CONTROL

CROSS-REFERENCE TO RELATED APPLICATIONS

This application claims benefit of U.S. Provisional Patent Application Ser. No. 61/093,288, filed Aug. 29, 2008, which is herein incorporated by reference.

BACKGROUND OF THE INVENTION

1. Field of the Invention

Embodiments of the present invention generally relate to a slit valve door and a method for sealing a chamber with a slit valve door.

2. Description of the Related Art

In semiconductor, flat panel display, photovoltaic/solar panel, and other substrate processing systems, it is common to arrange vacuum chambers (i.e., load locks, transfer chambers, process chambers) in a cluster, in-line, or a combination of cluster/in-line arrangements to process substrates. These systems may process substrates in single or batch substrate fashion. During processing, substrates may be transferred to and from chambers in which vacuum must be maintained or established. To allow access to the inside of the chamber, and to enable vacuum operation, an opening through the chamber wall in the shape of a slit is frequently provided to accommodate the substrate being processed.

At each interface between two vacuum chambers, a slit valve assembly may be present. A slit valve door may be movably actuated to open or close the slit valve passageway. The slit valve passageway, when open, permits one or more substrates to be transferred between the two vacuum chambers through the slit. When the slit valve passageway is closed by a slit valve door, substrates may not be transferred between the two vacuum chambers through the slit valve passageway and the two vacuum chambers are isolated from each other. For example, one of the vacuum chambers may be a process chamber which requires isolation from other chambers, such as other process chambers or a transfer chamber.

As the substrate size for manufacturing flat panel display grows, the manufacturing equipment for these substrates becomes larger in size as well. Accordingly, the door or gate that isolates one vacuum chamber (or load lock chamber) from another becomes larger or, more specifically, longer because the slot opening between the two chambers has to become longer to accommodate the large width of the substrate passing through the slot opening.

Therefore, there is a need for a slit valve door capable of sealing chambers used to process large area substrates.

SUMMARY OF THE INVENTION

Embodiments disclosed herein generally relate to methods for sealing a processing chamber with a slit valve door. The door initially raises from a position below the opening for the processing chamber to a raised position. The door then expands at a first speed of between about 12 mm/sec to about 18 mm/sec until a sealing member that is on the door just touches the sealing surface. Then, the door expands again at a second speed of between about 0.5 mm/sec to about 0.7 mm/sec to compress the sealing member against the sealing surface. The door expands by flowing a gas into the interior volume of the door. By controlling the pressure buildup within the door, the speed with which the door expands is controlled to ensure that the door gently contacts the sealing surface and then quickly compresses against the sealing surface. Thus, the door may be prevented from contacting the sealing surface with too great a force that may jolt or shake the processing chamber and produce undesired particles that may contaminate the process.

In one embodiment, a method of sealing a chamber coupled to a slit valve assembly is disclosed. The chamber has an opening sized to permit a substrate to pass therethrough. The method includes vertically actuating a slit valve door in a first direction within a slit valve assembly body from a first position to a second position, linearly actuating at least a first portion of the slit valve door for a first period of time, a first distance, and a first speed in a direction substantially perpendicular to the vertical actuation, and then linearly actuating the first portion of the slit valve door for a second period of time, a second distance, and a second speed. The slit valve door has one or more sealing members coupled thereto. The slit valve assembly body has and interior volume defined by walls and an opening extending through the slit valve assembly body that is aligned with the opening of the chamber. The second distance is less than the first distance, the second speed is less than the first speed, and the second period of time is about one-fourth the first period of time.

In another embodiment, a method of sealing a chamber having an opening sized to permit a substrate to pass therethrough is disclosed. The method includes flowing a gas into an interior of a slit valve door to pressurize the interior of the slit valve door to a first pressure. The slit valve door is disposed in a slit valve assembly body that is coupled with the chamber. The slit valve assembly body has an opening therethrough that is aligned with the opening of the chamber. The slit valve door has walls that enclose an interior volume. The method also comprises expanding the slit valve door until one or more sealing members coupled to the slit valve door contacts an interior surface of the walls and the slit valve door is spaced a first distance from the interior surface of the wall. The method also includes flowing the gas into the interior of the slit valve door to pressurize the interior of the slit valve door to a second pressure that is greater than the first pressure. The method also includes compressing the one or more sealing members between the slit valve door and the interior surface of the walls such that the slit valve door is spaced a second distance from the interior surface of the walls that is less than the first distance.

In another embodiment, a slit valve door assembly is disclosed. The assembly includes a slit valve chamber body having at least one opening sized to permit a substrate to pass therethrough. The slit valve chamber body has a first interior volume defined by walls. The assembly also includes a slit valve door disposed within the slit valve door chamber body. The slit valve door is expandable and has a second volume. The assembly also includes one or more sealing members coupled with the slit valve door, one or more springs disposed within the second interior volume, and one or more support shafts coupled with the slit valve door. An actuator is coupled with the one or more shafts and capable of raising and lowering the shaft and slit valve door within the slit valve door chamber body. The actuator is capable of moving the slit valve door from a first position below the at least one opening to a second position above the first position. The assembly also includes a control box coupled with the actuator, slit valve door, and slit valve door chamber body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2B is an isometric drawing of the control box 204 of FIG. 2A viewed from the bottom.

FIG. 3A is a schematic cross sectional view of a slit valve door assembly 300 with the slit valve door 306 in a lowered position.

FIG. 3B is a schematic cross sectional view of the slit valve door assembly 300 of FIG. 3A with the slit valve door 306 in a raised position.

FIG. 3C is a schematic cross sectional view of the slit valve door assembly 300 of FIG. 3A with the slit valve door 306 in the closed position.

FIG. 4A shows a slit valve door assembly 400 according to another embodiment with the slit valve door 402 in the raised position prior to expansion.

FIG. 4B shows the slit valve door assembly 400 of FIG. 4A with the slit valve door 402 expanded to the closed position.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to methods for sealing a processing chamber with a slit valve door. The door initially raises from a position below the opening for the processing chamber to a raised position. The door then expands at a first speed of between about 12 mm/sec to about 18 mm/sec until a sealing member that is on the door just touches the sealing surface. Then, the door expands again at a second speed of between about 0.5 mm/sec to about 0.7 mm/sec to compress the sealing member against the sealing surface. The door expands by flowing a gas into the interior volume of the door. By controlling the pressure buildup within the door, the speed with which the door expands is controlled to ensure that the door gently contacts the sealing surface and then quickly compresses against the sealing surface. Thus, the door may be prevented from contacting the sealing surface with too great a force that may jolt or shake the processing chamber and produce undesired particles that may contaminate the process.

The invention will be described below in regards to a slit valve assembly and chambers available from AKT America, Inc., a subsidiary of Applied Materials, Inc., Santa Clara, Calif. It is to be understood that the invention has utility using other slit valve assemblies and other chambers, including those sold by other manufacturers.

Figure 1:
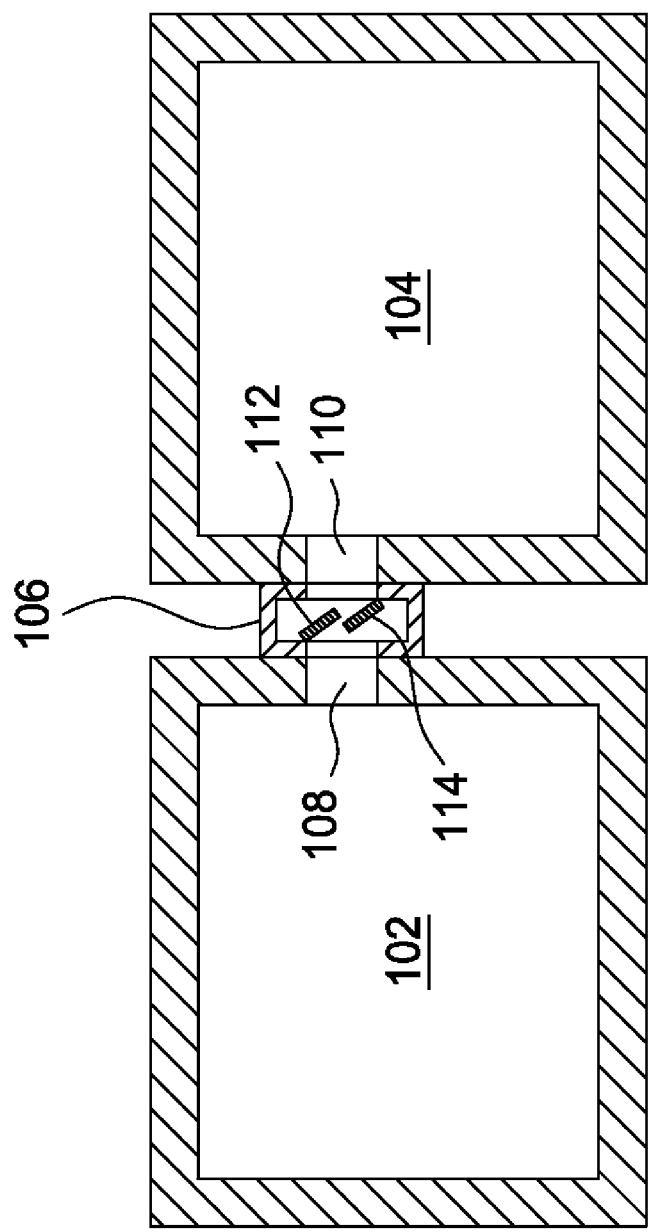
FIG. 1 is a schematic drawing of two chambers coupled to a slit valve assembly.

FIG. 1 is a schematic drawing of two chambers coupled to a slit valve assembly. As shown in FIG. 1, two chambers 102, 104 each have an opening 108, 110 therethrough that permit a substrate to enter and exit the chamber 102, 104. The chambers 102, 104 may be coupled together by a slit valve assembly 106 that seals the chambers 102, 104 to environmentally isolate the chambers 102, 104 from each other. The slit valve assembly 106 may have one or more doors 112, 114 that may seal the openings 108, 110.

Figure 2A:
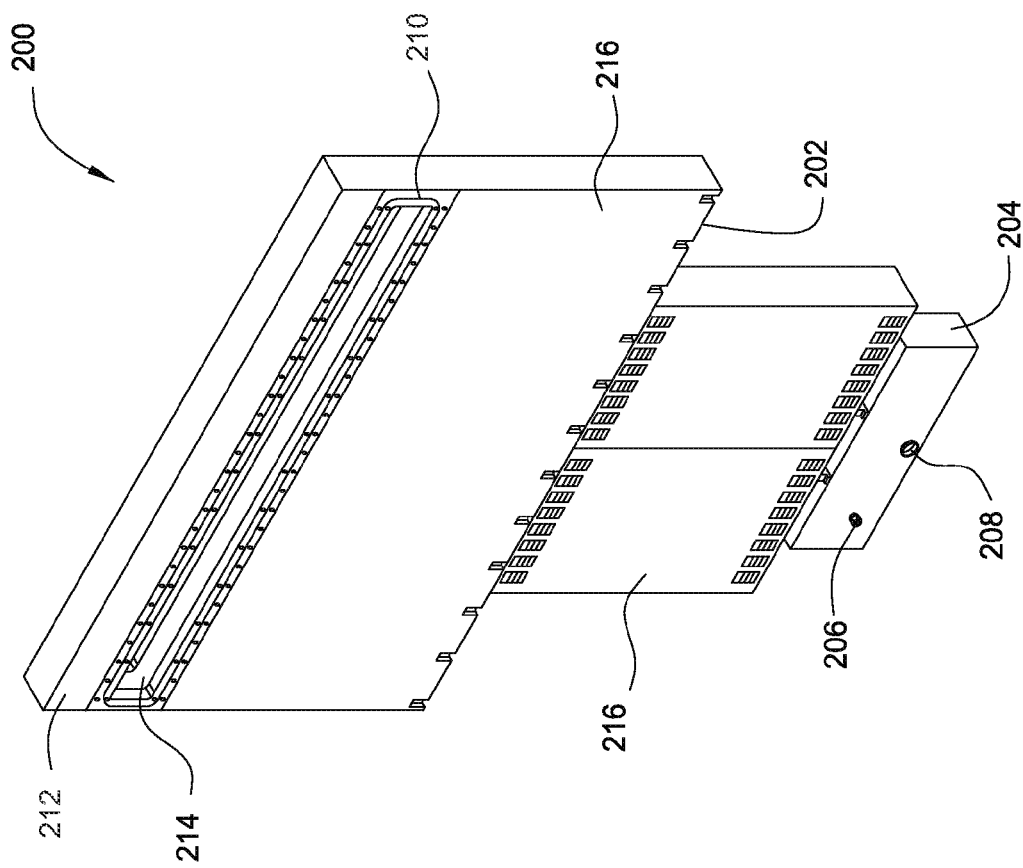
FIG. 2A is an isometric drawing of a slit valve assembly 200 according to one embodiment of the invention.

FIG. 2A is an isometric drawing of a slit valve assembly 200 according to one embodiment of the invention. The assembly 200 comprises an upper body having a sealing face 212 that interfaces with a chamber. An O-ring 210 may be present to ensure a good vacuum seal. The O-ring 210 surrounds an opening 214 in the body 202 that is sized to permit a substrate to pass therethrough.

The assembly 200 is controlled by a control box 204. FIG. 2B is an isometric drawing of the control box 204 of FIG. 2A viewed from the bottom. The control box 204 has numerous couplings 206, 208, 218, 220 to permit the control box 204 to be coupled to other components.

As will be discussed below, the slit valve door raises from a lowered position and then expands to press against the inside surface of the sealing face 212 of the assembly. To raise the slit valve door, vertical cylinders may be coupled to both the slit valve door and the control box 204. The vertical cylinders may be inside the cover 216. The cover spaces the body 202 from the control box 204. During processing, the body 202 may reach a temperature of over 150 degrees Celsius. Such temperatures may cause the electrical components of the control box 204 to fail. Thus, the cover 216 provides a thermal insulation for the control box 204. To provide additional thermal isolation, the control box 204 may be spaced from the cover 216 by one or more spacers 222. In one embodiment, the spacers 222 may comprise ceramic.

The coupling 206 may permit a nitrogen gas source to be coupled to the assembly 200. The nitrogen gas may be used to expand the slit valve door by flowing into the interior of the slit valve door. The couplings 218 may be coupled to a valve that permits the nitrogen gas to escape from the slit valve door when the slit valve door is opened. The nitrogen may be permitted to exit the slit valve door so that the slit valve door reaches atmospheric pressure. A vacuum pump may be coupled to the coupling 208 to evacuate the interior of the slit valve door and retract the expanded slit valve door. Clean, dry air may be provided to the actuators through coupling 220. The clean, dry air may be supplied to the actuators that move the vertical cylinders.

FIG. 3A is a schematic cross sectional view of a slit valve door assembly 300 with the slit valve door 306 in a lowered position. FIG. 3B is a schematic cross sectional view of the slit valve door assembly 300 of FIG. 3A with the slit valve door 306 in a raised position. FIG. 3C is a schematic cross sectional view of the slit valve door assembly 300 of FIG. 3A with the slit valve door 306 in the closed position. The slit valve door 306 is disposed in the assembly body 302. The body 302 has two openings 304A, 304B therethrough that permit substrates to pass from one chamber to another chamber.

It is to be understood that while the slit valve door 306 is shown and described as moving from a lowered position to a raised position, it is contemplated that a slit valve door may be used in which the slit valve door is actuated from a raised position above the slit valve opening to a lowered position in front of the slit valve opening.

The slit valve door 306 is raised by a vertical shaft 308 from a lowered position to a raised position. The vertical shaft 308 is controlled by a control box 310. The vertical shaft 308 is disposed within a cover 312. When the vertical shaft 308 moves up, so does the slit valve door 306. Additionally, when the vertical shaft 308 moves up, the cover 312 compresses.

Once in the raised position, a gas may be introduced into the interior volume 332 of the slit valve door 306. In one embodiment, the gas may comprise nitrogen. Sufficient gas may be introduced into the interior volume 332 of the slit valve door 306 to expand the slit valve door 306 so that the O-rings 314, 316 just touch the inside surfaces 318, 320 of the body 302. The slit valve door 306 expands to permit a first side 328 of the slit valve door 306 to move towards the inside surface 318 of the body 302. The slit valve door expansion also causes the second side 330 of the slit valve door 306 to move towards the inside surface 320 of the body that is opposite to the inside surface 318.

When the second side 330 of the slit valve door 306 moves, the control box 310 and vertical shaft 308 move laterally with the second side 330. The cover 312, however, pivots at the connection points 322A-D. In one embodiment, the vertical shaft 308 and the control box 310 may be displaced laterally with little or no vertical displacement occurring during the lateral movement.

One or more detectors 324 may be present to detect when the O-rings 314, 316 initially touch the inside surfaces 318, 320. The detectors 324 may send a signal to the control box 310 which may control not only the vertical movement of the shaft 308, but also the flow of the gas into the slit valve door 306. The flow of gas may be controlled based upon feedback from the detectors 324. Thereafter, the flow rate of the gas into the interior of the slit valve door 306 may be changed to compress the O-rings 314, 316 against the inside surfaces 318, 320 and provide a vacuum seal.

Thus, to close the slit valve door 306, a two step process may occur. In the first step, gas is introduced into the interior volume 332 of the slit valve door 306 at a first flow rate to permit the slit valve door 306 to expand a first distance such that the O-rings 314, 316 of the slit valve door initially come into contact with the inside surfaces 318, 320 of the slit valve door body 302. Then, gas is introduced into the interior volume 332 of the slit valve door 306 at a second flow rate to increase the pressure in the inside of the slit valve door 306 and thus, compress the O-rings 314, 316 against the inside surfaces 318, 320 of the body 302 and thus, provide an effective seal. The compression involves expanding the slit valve door 306 a second distance that is less than the first distance.

By expanding the slit valve door 306 until the O-rings 314, 316 just touch the inside surfaces 318, 320 of the body 302, the slit valve door 306 may be prevented from contacting the inside surface 318, 320 of the body 302 with too much force. If the slit valve door 306 expands and contacts the inside surfaces 318, 320 of the body 302 with too much force, the slit valve assembly 300, and any chambers coupled thereto, may be jolted which may cause particles to be created and contaminate the substrates in the chambers or that pass through the slit valve assembly 300.

In one embodiment, the first step may occur for between about 1 second to about 2 seconds and expand the slit valve door 306 between about 15 mm to about 20 mm. In another embodiment, the second step may occur for between about 1 second to about 2 seconds and expand the slit valve door 306 between about 1 mm to about 1.25 mm.

To open the slit valve door 306, the interior volume 332 of the slit valve door 306 may be vented to atmosphere. However, the slit valve door 306 may not retract fully. Therefore, the interior volume 332 of the slit valve door 306 may be evacuated by a vacuum pump that may be coupled with the slit valve door 306. By drawing a vacuum in the interior volume 332 of the slit valve door 306, the slit valve door 306 may retract back to its original position. Once fully retracted, the slit valve door 306 may then be lowered.

In one embodiment, the slit valve door 306, vertical shaft 308, and control box 310 may be laterally displaced after the slit valve door 306 has been raised. The lateral displacement may occur with little or no expansion of the slit valve door 306 such that the O-ring 314 just touches the inside surface 320 of the body 302. Thereafter, the slit valve door 306 may be expanded by introducing a gas into the interior volume 332 of the slit valve door 306 such that the O-ring 316 just touches the inside surface 318 of the body 302. Then, more gas may be introduced into the interior volume 332 of the slit valve door 306 to compress the O-rings 314, 316 against the inside surfaces 318, 320 of the body 302. To open the slit valve door 306, the interior volume 332 may be vented to atmosphere and then evacuated. Thereafter, the slit valve door 306 may be lowered.

In another embodiment, the slit valve door 306 may be under vacuum prior to being raised. The slit valve door 306 may have the interior volume 322 evacuated when the slit valve door 306 is in the lowered position. Then, when the slit valve door 306 is raised, the interior volume 332 of the slit valve door 306 may be vented to atmosphere for a time sufficient to permit the O-rings 314, 316 to touch the inside surfaces 318, 320 of the slit valve assembly body 302. Then, the interior volume 332 of the slit valve door 306 may be vented to atmosphere to permit the O-rings 314, 316 to compress against the inside of the slit valve door assembly 300 and thus provide a vacuum seal. The slit valve door 306 may expand due to a compression mechanism, such as a spring, that is permitted to expand from a compressed position to an expanded position and thereby push out or expand the slit valve door 306. To open the slit valve door 306, the interior volume 332 of the slit valve door 306 may be evacuated and/or the compression mechanism may be compressed.

FIG. 4A shows a slit valve door assembly 400 according to another embodiment of the invention with the slit valve door 402 in the raised position prior to expansion. FIG. 4B shows the slit valve door assembly 400 of FIG. 4A with the slit valve door 402 expanded to the closed position. To assist in expanding the slit valve door 402, one or more springs 404 may be placed in a volume 406 within the slit valve door 402. The gas may be introduced into the volume 406 to compress the springs 404 and press the O-rings against the sealing surface inside the slit valve door body. Volume 406 may be coupled with a vacuum pump to evacuate the volume 406 and permit the springs 404 to expand back to their normal position. It is to be understood that while a spring 404 has been shown and described, other items may be utilized that are capable of resisting compression.

It is to be understood that while the slit valve door 402 is shown and described as moving from a lowered position to a raised position, it is contemplated that a slit valve door may be used in which the slit valve door is actuated from a raised position above the slit valve opening to a lowered position in front of the slit valve opening.

Figure 5:
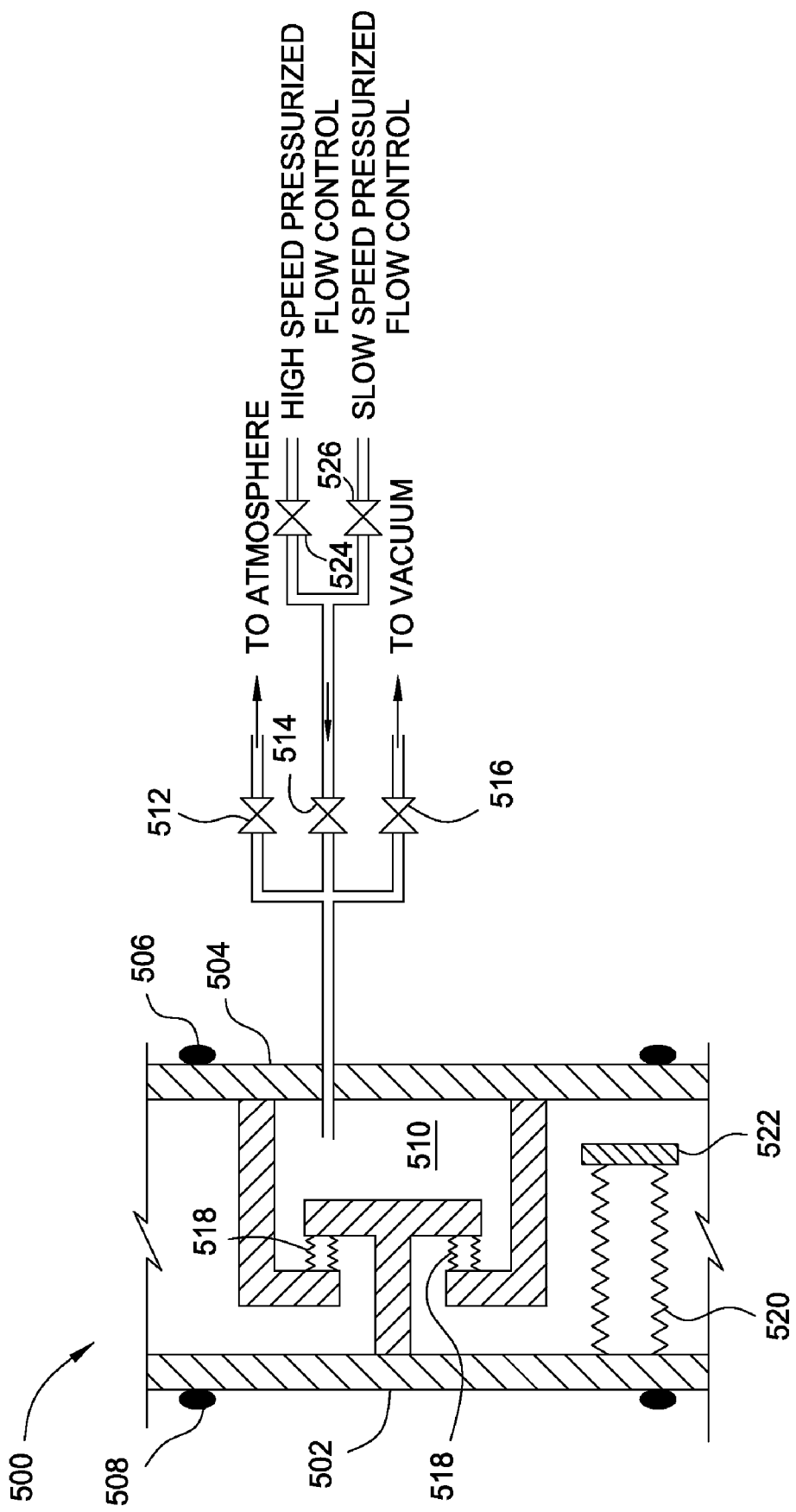
FIG. 5 is a schematic cross sectional view of a slit valve assembly 500 according to another embodiment.

FIG. 5 is a schematic cross sectional view of a slit valve door 500 according to another embodiment of the invention. The slit valve door 500 comprises two door surfaces 502, 504 and two O-rings 506, 508 that will close an opening in the slit valve door 500 and seal the chamber when the slit valve door 500 is expanded. An interior volume 510 of the slit valve door 500 may be filed with a processing gas to expand the slit valve door 500. Bellows 518 may be present to seal the volume 510 and permit an increase in pressure within the volume 510. The volume may be coupled to atmosphere, the gas source, and to vacuum through a plurality of valves 512, 514, 516 that are opened and closed as needed.

An additional bellows 520 may also be present. The bellows 520 may be coupled to one or both sides of the slit valve door 500. In one embodiment, the bellows 520 is coupled to a contact 522. The bellows 520 and contact 522 function as a shock absorber when the slit valve door is contracted to prevent the slit valve door 500 from jolting and generating particles that may contaminate substrates. During the contraction of the slit valve door 500, the contact 522 gently contacts the inside surface of the slit valve door and then the bellows 520 gently compresses as the slit valve door 500 compresses. It is to be understood that while a bellows 520 is described, other compression resistant elements may be utilized such as a spring.

Figure 6:
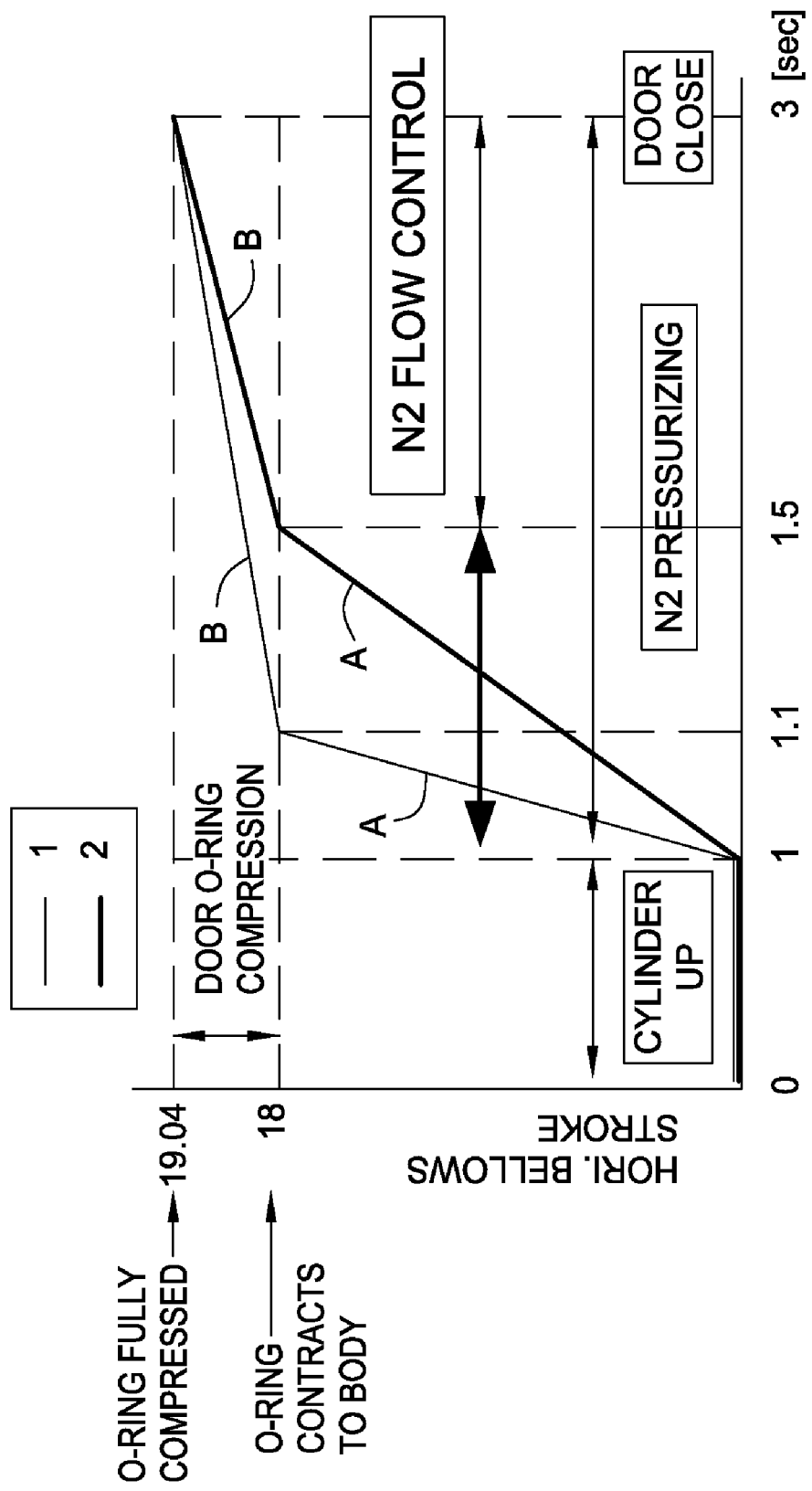
FIG. 6 is a graph showing sequences for closing a slit valve door.

When closing the slit valve door 500, a gas may be introduced into the interior volume 510 to increase the pressure in the volume 510. The gas may be introduced in a sequence to ensure that the slit valve door 500 does not generate particles upon closure. FIG. 6 is a graph showing sequences for closing a slit valve door according to embodiments of the invention. During slit valve door 500 closure, the valves 512, 516 open to atmosphere and vacuum may be closed. The slit valve door 500 may be raised for a first period of time. In FIG. 6, 1 second is exemplified as the time period to raise the slit valve door 500. Thereafter, the slit valve door 500 may be expanded. The slit valve door 500 may be expanded until the O-rings 506, 508 contact the walls of the slit valve door body in the first step of the expansion.

In FIG. 6, the first expansion is shown by line A, which expands the slit valve door 500 about 18 mm. The first expansion may occur by opening valve 524 to permit the gas to enter the interior volume 510 at a high rate by controlling the flow with a controller. For example 1, the expansion occurs in about 0.1 seconds while in example 2, the expansion occurs in about 0.5 seconds. Thereafter, the O-rings 506, 508 are compressed against the slit valve door body. The compression occurs by increasing the pressure in the interior volume 510 by closing valve 524 and opening valve 526. Gas then flows to the interior volume to slowly pressurize the interior volume 510 to a higher pressure. In Example 1, compression of the O-rings 506, 508 occurs in about 1.9 seconds. In Example 2, compression of the O-ring occurs in about 1.5 seconds. In either example 1 or example 2, the compression step occurs for longer than the initial expansion. Additionally, the compression steps last longer than the time to raise the slit valve door 500. It is to be understood that the time periods used in examples 1 and 2 are simply for example only and not to be limiting of the invention. Other time periods, as determined by the technician, may be utilized. For example, the time periods may be longer, but substrate throughput may be compromised. The ratio of the compression time to the initial expansion time may be between about 3:1 to about 19:1.

By expanding a slit valve door in a two step process, unnecessary jolting or shaking of the slit valve assembly or chamber attached thereto may be reduced. The two step process may permit a chamber to be sealed without generating particles that may contaminate the substrate being processed, or substrates that will later be processed.

While the foregoing is directed to embodiments of the present invention, other and further embodiments of the invention may be devised without departing from the basic scope thereof, and the scope thereof is determined by the claims that follow.

The invention claimed is:

1. A method of sealing a chamber coupled to a slit valve assembly, the chamber having an opening sized to permit a substrate to pass therethrough, the method comprising:

actuating a slit valve door within a slit valve assembly body in a first direction from a first position to a second position, the slit valve door having one or more o-rings coupled thereto, the slit valve assembly body having an interior volume defined by walls, the slit valve assembly body having an opening extending through the slit valve assembly body that is aligned with the opening of the chamber;

actuating at least a first portion of the slit valve door in a second direction substantially perpendicular to the first direction for a first period of time, a first distance, and a first speed of between about 12 mm/sec to about 18 mm/sec;

detecting when the one or more o-rings contact an inside surface of the walls; and actuating the first portion of the slit valve door in the second direction in response to the detecting for a second period of time, a second distance, and a second speed such that the second distance is less than the first distance, the second speed is between about 0.5 mm/sec and about 0.7 mm/sec, and the second period of time is less than the first period of time.

2. The method of claim 1, further comprising increasing the interior volume of the slit valve door during the actuating in the second direction.

3. The method of claim 1, wherein the one or more O-rings compress against an interior surface of the wall during the second period of time.

4. The method of claim 1, further comprising detecting when the one or more o-rings initially contacts an interior surface of the wall.

5. The method of claim 1, wherein the actuating in the second direction further comprises flowing a gas into an interior of the slit valve door and expanding the slit valve door.

6. The method of claim 1, the actuating in the second direction further comprising extending the first portion of the slit valve door in the second direction and simultaneously moving a second portion of the slit valve door in a third direction opposite to the second direction for a distance substantially equal to the first distance.

7. The method of claim 6, wherein the slit valve door is coupled to a support shaft and a control panel, wherein the support shaft and the control panel move in the third direction as the second portion moves in the third direction.

8. The method of claim 6, further comprising contacting an interior surface of the wall with the second portion.

9. The method of claim 8, wherein the second portion is coupled to one or more second O-rings, and further comprising detecting when the one or more second O-rings contact the interior surface.

10. The method of claim 9, further comprising compressing the one or more second O-rings against the interior surface during the actuating in the second direction.

11. The method of claim 1, further comprising compressing one or more springs within the slit valve door simultaneously with the actuating in the second direction.

12. The method of claim 1, further comprising flowing a gas into the interior volume of the slit valve door.

13. A method of sealing a chamber having an opening sized to permit a substrate to pass therethrough, comprising:

flowing a gas into an interior of a slit valve door to pressurize the interior of the slit valve door to a first pressure, the slit valve door disposed in a slit valve assembly body that is coupled with the chamber, the slit valve assembly body having an opening therethrough that is aligned with the opening of the chamber, the slit valve door having walls that enclose an interior volume;

expanding the slit valve door until one or more O-rings coupled to the slit valve door contacts an interior surface of the walls and the slit valve door is spaced a first distance from the interior surface of the walls, the expanding occurring at a first speed of between about 12 mm/sec to about 18 mm/sec;

flowing the gas into the interior of the slit valve door to pressurize the interior of the slit valve door to a second pressure; and compressing the one or more O-rings between the slit valve door and the interior surface of the walls such that the slit valve door is spaced a second distance from the interior surface of the walls that is less than the first distance, the compressing occurring at a second speed of between about 0.5 mm/sec and about 0.7 mm/sec.

14. The method of claim 13, further comprising detecting when the one or more O-rings contact the interior surface of the wall.

15. The method of claim 14, further comprising controlling the flow of gas into the interior of the slit valve door in response to the detecting.

16. The method of claim 13, further comprising raising the slit valve door from a position below the opening.

17. The method of claim 13, further comprising compressing one or more springs within the slit valve door while flowing the gas into the interior of the slit valve door.

18. The method of claim 13, further comprising compressing one or more springs while flowing the gas into the interior of the slit valve door, the one or more springs disposed within the slit valve door.

* * * * *